US007157641B2

(12) United States Patent
Gregg (10) Patent No.: US 7,157,641 B2
(45) Date of Patent: Jan. 2, 2007

(54) ORGANIC PHOTOVOLTAIC CELLS WITH AN ELECTRIC FIELD INTEGRALLY-FORMED AT THE HETEROJUNCTION INTERFACE

(75) Inventor: Brian A Gregg, Golden, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/535,561

(22) PCT Filed: Sep. 16, 2004

(86) PCT No.: PCT/US2004/030201

§ 371 (c)(1),
(2), (4) Date: May 19, 2005

(87) PCT Pub. No.: WO2005/029592

PCT Pub. Date: Mar. 31, 2005

(65) Prior Publication Data

US 2006/0130893 A1 Jun. 22, 2006

Related U.S. Application Data

(60) Provisional application No. 60/503,336, filed on Sep. 16, 2003.

(51) Int. Cl.
*H01L 31/04* (2006.01)
(52) U.S. Cl. .................. 136/263; 136/256; 136/250; 136/291; 136/252; 257/40; 257/43; 257/431; 257/461; 257/464; 257/465; 438/63; 438/82; 438/85; 438/98
(58) Field of Classification Search ............. 136/263, 136/256, 291, 250, 252; 257/40, 43, 431, 257/461, 464, 465; 438/63, 82, 85, 98; 977/932, 977/948; 52/173.3, 204.5
See application file for complete search history.

(56) References Cited

U.S. PATENT DOCUMENTS 5,720,827 A 2/1998 Simmons (Continued)

FOREIGN PATENT DOCUMENTS

JP 2003-332600 A * 11/2003
WO WO 2005/029592 A1 * 3/2005

OTHER PUBLICATIONS

Tsuzuki et al, "Photoelectrical conversion of p-n heterojunction devices using thin films of titanyl phthalocyanine and a perylene pigment," Thin Solid Films, vol. 273, (1996), 177-180.*

(Continued)

*Primary Examiner*—Nam Nguyen
*Assistant Examiner*—Anthony Fick
(74) *Attorney, Agent, or Firm*—Paul J. White (57) ABSTRACT

A bi-layer photovoltaic cell, and method (100) of making same, with an electric field applied at the p-n heterojunction interface. The cell includes a first semiconductor layer including a binder, nanocrystals of an n-type semiconductor, and spatially bound cations and a second semiconductor layer contacting the first semiconductor layer that includes a binder, nanocrystals of a p-type semiconductor, and spatially bound anions. The cell further includes a p-n heterojunction at the contacting interface between the first and second semiconductor layers. An electric field is created by the spatially bound cations and anions that are located in the layers proximal to the p-n heterojunction. The nanocrystals are single crystals of organic semiconductors that are less than 50 nanometers in size and that comprise a majority of the volume of their respective layers. The binder is a polymer matrix, such as an epoxy. The cell includes electrical contacts abutting the semiconductor layers.

32 Claims, 5 Drawing Sheets

U.S. PATENT DOCUMENTS

| | | | |
|---|---|---|---|
| 6,099,637 A * | 8/2000 | Cordaro | 106/635 |
| 6,352,777 B1 * | 3/2002 | Bulovic et al. | 428/411.1 |
| 6,559,375 B1 | 5/2003 | Meissner et al. | |
| 2002/0157702 A1 * | 10/2002 | Cordaro | 136/256 |
| 2004/0118448 A1 | 6/2004 | Scher et al. | |

OTHER PUBLICATIONS

Gregg, "Bilayer molecular solar cells in spin-coated TiO2 substrates," Chemical Physics Letters, vol. 258, (1996), pp. 376-370.*

Brown et al, "Charge carrier generation and exciton quenching at M3EH-small molecule and M3EH-PPV/oxide interfaces," IEEE, (2000), pp. 1186-1189.*

Gregg, "Excitonic Solar Cells," J. Phys. Chem. B, (2003), vol. 107, 4688-4698.*

* cited by examiner

ORGANIC PHOTOVOLTAIC CELLS WITH AN ELECTRIC FIELD INTEGRALLY-FORMED AT THE HETEROJUNCTION INTERFACE

REFERENCE TO RELATED APPLICATIONS

This application is the National Stage of International Application No. PCT/US04/30201, filed Sep. 16, 2004, which claims the benefit under 35 U.S.C. §119(e) of U.S. Provisional Application 60/503,336, filed Sep. 16, 2003.

TECHNICAL FIELD

The present invention relates generally to photovoltaic cells and semiconductors and their manufacture, and more particularly, to organic photovoltaic cells and methods of manufacturing bi-layer organic photovoltaic cells with improved solar conversion efficiencies achieved by controlling the amount of recombination occurring at the p-n heterojunction or interface between the p-type and n-type semiconductor layers.

BACKGROUND ART

The conversion of solar energy into electrical energy is becoming more important as costs and shortages of more standard energy sources continue to increase. Standard solar cells made from inorganic semiconductors, such as silicon cells, have been studied since the 1950s and have been used as renewable electric power sources for generating power in a wide variety of applications ranging from orbiting satellites to solar farms to portable devices. While relatively efficient, inorganic solar cells often have high dollar and environmental costs associated with manufacturing as the cells are made of toxic materials that typically have to be grown as a single large crystal.

More recently, solar cells utilizing organic materials have appeared, which has raised the intriguing possibility of solar cells that are relatively inexpensive and can be fabricated on flexible substrates. It is envisioned that organic solar cells could be fabricated or even painted on large flexible substrates, which would allow the created cells to be folded or rolled up in a briefcase or backpack, to be worn, or to be deployed to provide electricity for wearable electronics, for recharging batteries, and for low-power devices. Unfortunately, the solar conversion efficiencies of existing organic solar or photovoltaic (PV) cells is typically less than 10 to 20 percent of the solar conversion efficiencies obtainable in inorganic PV cells or in some cases, only 1 to 2 percent conversion efficiency. There is a need to find a method of producing organic PV cells that are more efficient in converting solar energy to electricity and that still provide the advantages of working with organic materials, i.e., being inexpensive and relatively easy to manufacture in high volumes on flexible substrates. Once such a manufacturing method is found, flexible organic solar cells likely will be widely used to provide efficient distributed power to homes and buildings and to provide power in applications requiring portability, such as many military and consumer uses.

In developing an improved technique of manufacturing organic solar cells, it is important to understand the differences between organic solar cells and the more common inorganic solar cells and to understand manufacturing problems associated with organic solar cells. A key difference between organic photovoltaic (OPV) cells and conventional inorganic photovoltaic (IPV) cells, e.g., the silicon p-n junction cell, is the relative importance of interfacial processes between layers of semiconductor materials (such as between p-type and n-type semiconductor layers). This difference is closely related to the charge generation mechanism needed for producing a useful PV cell. In IPV cells, electron-hole pairs are generated immediately upon light absorption throughout the bulk of the material according to the exponential decrease of the incident light intensity. Since the electrons and holes are distributed spatially within the same material, the photoinduced chemical potential energy gradient drives both the electrons and holes in the same direction and recombination of the holes and electrons needs to be controlled throughout the bulk.

In contrast, light absorption in OPV cells typically results in the production of a mobile excited state, i.e., a tightly bound electron-hole pair often called an exciton, rather than a free electron-hole pair. Dissociation of the excitons occurs at the heterointerface between two dissimilar organic semiconductor materials or layers. Hence, light absorption results in free electrons in one of the two semiconductor materials and free holes on the other side of the interface in the other semiconductor material, with the free electrons and holes being driven in opposite directions away from the interface. In other words, carrier generation is simultaneous to, and identical with, carrier separation across the interface in OPV cells. Recombination of the free electrons with the holes is a bane of IPV and OPV cells. However, due to the differences in the dissociation mechanisms of OPV and IPV cells, recombination is a particular problem at the interface in OPV cells. Recombination is a larger problem at the interface in OPV cells due to the much larger concentration of carriers at the interface when compared to IPV cells in which the carriers are distributed in the bulk.

In practice, a uniform electric field is typically applied across the PV cell to cause the electrons to separate from the paired holes. This is an effective approach for IPV cells in which the electrons can only be separated from the holes by applying such an electrical potential-energy gradient, but application of a uniform electric field across the bulk has not proven effective in OPV cells where a critical efficiency limitation is recombination at the interface of the two semiconductor layers. More particularly, under "forward" bias, the OPV cell typically will only produce small current levels as a consequence of this interfacial recombination and of electrons being photogenerated on one side of an interface and holes on the other. When the applied bias drives the photogenerated carriers back toward the interface (i.e., forward bias for a p-n junction), the carriers typically recombine and only a small number is thermally emitted over the heterointerface energy barrier (i.e., an energy band diagram shows an energy offset at the interface).

To enhance efficiency including addressing a low forward bias current, IPV cells rely on the ability to dope semiconductors precisely both in magnitude and spatial extent. Unfortunately, doping of organic materials is a difficult and often impractical process that has not addressed the low efficiency issues in OPV cells. One difficulty with doping in OPV cells is that the integrity of the organic semiconductor materials are often chemically or morphologically disturbed, which can create exciton traps or quenching cites that block diffusion and/or cause recombination.

Crystalline organic semiconductors have been shown to have superior optical and electrical characteristics when compared to amorphous films of the same materials. However, single crystals of organic semiconductors generally cannot be used for devices, such as for OPV cells, because the crystals are quite small, i.e., 0.1 to 10 μm, and do not adhere well to most substrates or to other organic semiconductors. This lack of good adhesion is a problem that must be addressed in manufacturing an OPV cell because good crystal-to-crystal contact is required throughout the cell to maintain electron and hole paths. When the conventional method of sublimation is used to apply organics to a surface, the resulting film is commonly amorphous or nanocrystalline but is usually not strongly adherent and often causes serious interfacial adhesion problems. Attempts have been made to address this problem with annealing by heating or exposing the films to a solvent vapor, but to date, the resulting crystalline films have had numerous pinholes that have led to semiconductor devices with unacceptable electrical shorts.

Hence, there remains a need for improved organic photovoltaic cells, and methods of manufacturing such cells, that provide enhanced solar conversion efficiency while facilitating the manufacture of high efficiency, inexpensive, and flexible organic solar cells. Preferably, such cells will address the problem of recombination at the heterojunction interface while utilizing readily available and inexpensive materials that can be processed utilizing relatively well-known manufacturing techniques.

DISCLOSURE OF THE INVENTION

The present invention addresses the above problems by providing an improved method for fabricating photovoltaic or solar cells. In general, the method uses nanocrystalline semiconductors that are dispersed in a polymeric binder, such as epoxy cement, to create a bi-layer organic photovoltaic (OPV) cell. In one embodiment, n-type PPyEI is dispersed in epoxy and coated on a flexible contact or substrate and p-type TiOPc is dispersed in epoxy and coated in a thin film on a flexible contact or substrate. The n-type film is then bonded to the p-type film, such as with hot rolling or annealing, to form the bi-layer cell. In many embodiments, the process includes building in an electric field at the interface between the p-type and n-type films, i.e., the p-n heterojunction or interface. For example, charge additives (i.e., materials that provide cations and anions, respectively) are dispersed in the n-type material and in the p-type material before application to the contacts. Upon bonding of the semiconductor films, uncompensated positive and negative charges or cations and anions are produced proximal to the interface or p-n heterojunction, which results in an electric field being integrally formed with the OPV cell at the interface or being dropped at the interface rather than uniformly across the cell as in prior cells. While the cell fabrication method is particularly useful in solving numerous problems related to the use of organic semiconductors in solar cells, the method may be modified to employ inorganic semiconductor nanocrystals (such as quantum dots, quantum rods, and the like) in place of or in combination with the nanocrystalline organic semiconductors.

The method of the invention and cells fabricated according to the method address a number of problems previously associated with using organic materials to form solar cells. The method effectively controls the generation of pinholes in crystalline films associated with doping of organic semiconductors and, thus, allows the use of single crystal semiconductors that provide superior mobilities and exciton diffusion lengths. The method utilizes polymers that are readily available, are easily processed with known polymer fabrication techniques, and create a flexible finished product, e.g., OPV cells that are flexible and durable. The nanocrystalline organic semiconductors can be selected to achieve both a desired effective bandgap, such as about 1.4 eV, and a thickness that is relative small such that cells of the invention absorb light without adding unnecessary resistance, wasting energy, or adding material costs (e.g., cells manufactured according to the method of the invention can absorb all or nearly all sunlight with wavelength in the range of 350 to 900 nm).

The bonding techniques of the method and materials selections, such as using epoxy or other polymers, lends itself to providing effective bonding at the p-n interface and crystal-to-crystal contact. These techniques eliminate, or at least better control, the serious interfacial adhesion problem of prior organic semiconductor devices. The OPV cells made according to the invention may be utilized in numerous manners and products such as in conventionally designed solar cell devices, in power windows that incorporate the OPV cells of the invention with contacts and p and n-films selected to be transparent or partially transparent to visible light, and in other products.

According to one aspect of the invention, PV cells are formed that provide the desired concentrated interfacial electric field with one or both of the binder layers made from polymers that already contain ionic groups. These cells do not require added cation or anion additives. In one example, poly(vinylpyridine) is quaternized with, for example, methyl iodide to produce a polymer with bound cationic groups. Such a polymer is then used as the binder layer for the n-type side without any additional ionic additives. Likewise, commercially available poly(styrene) terminated with sodium carboxylate groups or other similar materials are used for the binder layer for the p-type side without any additional ionic additives.

According to another aspect of the invention, the method is modified such that the bound ions are incorporated into the OSCs (crystalline organic semiconductors) themselves, rather than into the binders. For example: (1) PPyEI can be partially quaternized to create bound positive charges; and (2) TiOPc can be partially sulfonated to create bound negative charges. These OSCs with bound ions can then be dispersed in electrically neutral polymer binders to provide the same overall effect of applying an electric field at the interface between the two semiconductor layers and of controlling recombination in the cell.

DETAILED DESCRIPTION OF THE PREFERRED EMBODIMENTS

The present invention is directed generally to a method of fabricating a bi-layer organic photovoltaic (OPV) cell that includes dispersing semiconductor nanocrystals in a binder, such as a polymer binder (e.g., an epoxy) that is applied to conductive substrates to form an n-type substrate and a p-type substrate. The two substrates are then bound together such that there is good adhesion between the n-layer and p-layer and crystals within these layers to form a bi-layer OPV cell with improved efficiency (i.e., up to 5 percent or more whereas existing OPV cells typically have 2 percent or lower efficiencies). As will become clear from the following description, one important aspect of the method of the invention is building an electric field at the p-n heterojunction or interface between the semiconductor films so as to control detrimental recombination which occurs almost solely at this interface. The electric field is provided integral to the OPV cell by covalently binding ions to the binder in each of the p-layer and the n-layer, with oppositely charged ions dispersed in each layer near the interface.

The inventor recognized that OPV cells in general have differing characteristics than inorganic PV cells and that disassociation occurs at the p-n heterojunction. Further, the heterojunction is the location of all or most of the recombination of free electrons and holes. Prior devices applied the electric fields at the ends of the cells, which created a relatively constant or uniform electric field across the cell. This led to very inefficient organic PV cells with a significant amount of recombination occurring at the junction or interface. The inventor further recognized that organic PV cells differ from inorganic PV cells in that excitons are formed rather than relatively uniform electron-hole pairs as with inorganic PV cells, and further, the band diagram for an organic PV cell shows a significant offset at the junction or interface.

With an understanding of these differences between organic and inorganic PV cells, the inventor designed the method of the present invention for dropping or applying a concentrated electric field or dipole at or near the p-n heterojunction or semiconductor interface so as to control recombination, i.e., to apply the energy in a built-in manner at the location in the cell where the energy is most needed to allow electron flow through the cell. The following description stresses the use of the fabrication method for producing OPV cells, but the fabrication method is equally applicable to nanocrystalline inorganic semiconductors, such as quantum dots, quantum rods, and the like, which may be used in place of or in combination with nanocrystalline organic semiconductors to, in some cases, provide an even more effective solar cell.

Figure 1:
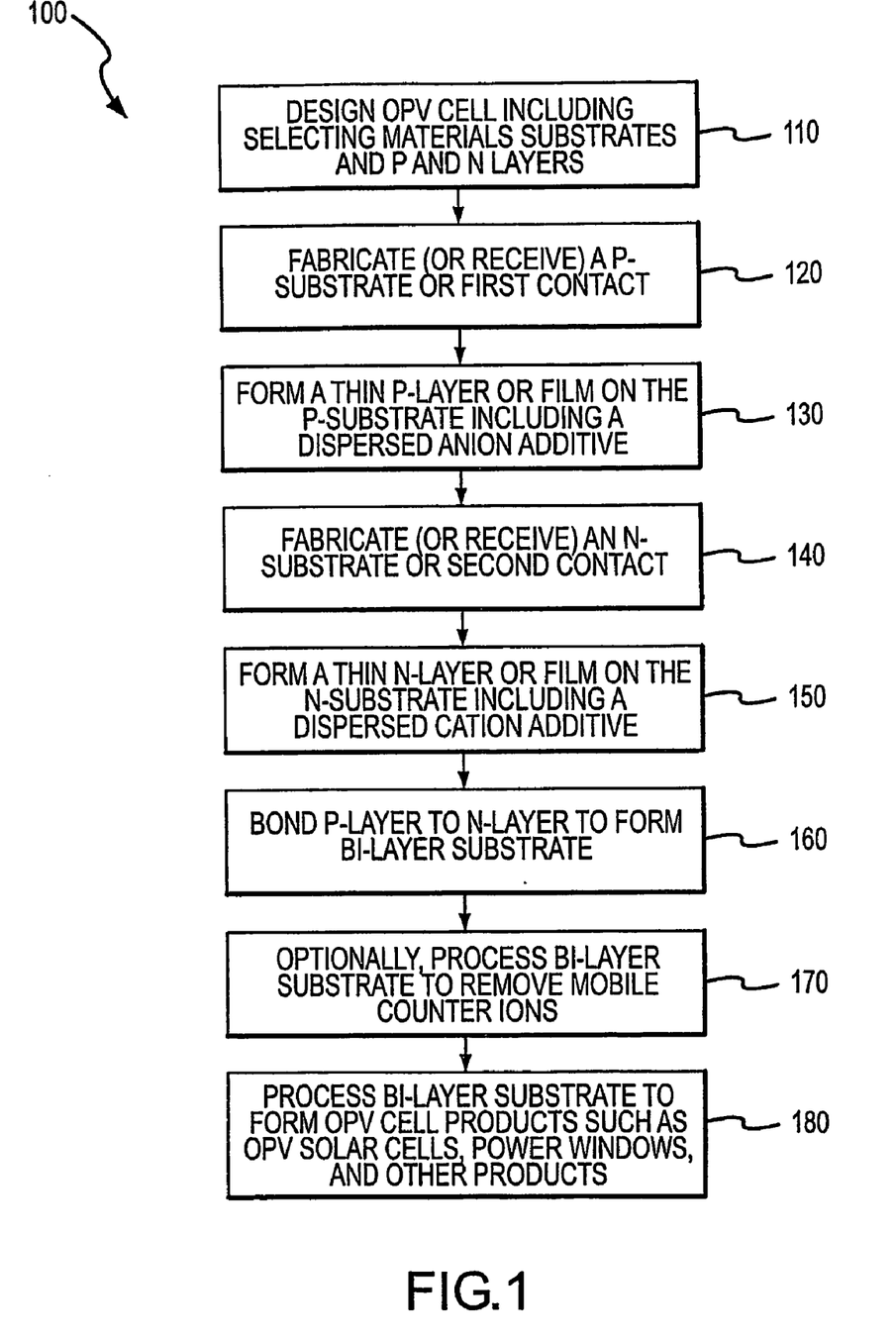
FIG. 1 is a flow chart of an exemplary process for making an organic photovoltaic (OPV) cell with an integral electric field concentrated at the heterojunction interface and products containing such an OPV cell.

FIG. 1 illustrates an exemplary method 100 of fabricating OPV cells with enhanced efficiencies, i.e., 5 to 20 percent or more depending upon whether or not a built in electric field is provided at the p-n heterojunction. The fabricating method 100 begins at 110 with the designing of an OPV cell including selecting appropriate materials for the contacts and p-type and n-type semiconductor layers. As discussed previously, OPV cells formed according to the concepts of the invention are generally bi-layer devices that utilize nanocrystals (which may be inorganic semiconductors and/or organic semiconductors), which are single crystals that are less than about 50 nm in size. The nanocrystals are dispersed within a binder, e.g., a polymer binder, which in one embodiment, is epoxy.

Preferably, the nanocrystals selected for the p and n layers of the cell are selected to provide an effective bandgap that is at or near the optimal effective bandgap of 1.4 eV. In one embodiment, the nanocrystals are organic semiconductors comprising n-type PPyEI and p-type TiOPc. However, numerous other semiconductor crystals could be used to practice the invention with this selection being only exemplary of one pair that provides a 1.4 eV bandgap with materials that are readily available and processible. The quantity of crystals or ratio relative to other materials in the p and n layers is preferably as high as practical to still allow proper binding so as to provide better crystal-to-crystal contact. In this regard, the n-type and p-type crystals may make up 40 to 70 percent or more and typically, around 60 percent of the material volume in these layers (with the specific volume percentage of the materials varying somewhat with the particular materials selected).

As discussed below, a built-in electric field at the interface is provided by dispersing a small quantity, such as less than about 5 percent by volume, of charge additives or cation additives and anion additives to provide uncompensated charges at the interface upon bonding of the p and n layers. The electric field is produced by covalently binding ions to the binder, such as an epoxy. On the n-type side, one useful charge additive is quaternized triethanolamine, and on the p-type side, several charge additives can be used such as glycerol-2-phosphate, glucose-6-phosphate, and the like (while solubility issues with some solvent materials used in forming the p and n layers should be considered). The important point for creating OPVs is that the materials selected for the charge additives be such that positive charges or positively charged ions are produced in the n-layer near the interface and negative charges or negatively charged ions are produced in the p-layer near the interface so as to produce the desired electric field or dipole to control recombination.

The materials selected for the contact layers or substrates may be nearly any useful contact materials well known in the semiconductor and solar cell industry. In many embodiments, the substrate is formed so as to be flexible which can be achieved using relatively thin substrates of materials such as aluminum (AL), stainless steel, indium tin oxide (ITO) or ITO on a polymer, and the like. In some cases, one contact is a reflector, such as AL, with the other contact allowing sunlight to pass freely, i.e., is transparent, such as ITO. In other cases, such as in the power window example discussed below, it is preferable that the materials selected for both contacts be transparent or at least partially transparent (as well as the semiconductor crystals selected).

Crystalline organic semiconductors (OSCs) have superior optical and electrical characteristics compared to amorphous films of the same materials. A problem that has to be overcome, though, is that single crystals of OSCs have not been successfully used for devices because the crystals are quite small (e.g., 0.1 to 10 μm) and do not adhere well to most substrates or to other organic semiconductors. This lack of good adhesion across interfaces is a major problem for the use of organic semiconductors, even as amorphous films. The following method steps are believed to address this adhesion problem and to allow OSCs to be effectively utilized in a bi-layer OPV cell.

Referring again to FIG. 1, the method 100 continues at 120 with fabricating a p-substrate or first contact upon which the p-layer is to be formed. Alternatively, the method 100 can be performed by simply receiving and building on a substrate that is formed in a separate process such as by a third party or distributor of such materials and products. The substrate may be formed of numerous electrically conductive materials and may be blocking or non-blocking depending on the intended use of the cell. Additionally, the substrate may be flexible or be rigid to support desired physical characteristics of the finished cell product. The materials may be materials such as AL, ITO, $SnO_2$, and the like. In other embodiments, the p-substrate or first contact is formed on the p-layer, such as by evaporation (i.e., step 120 is performed after step 130).

At 130, a thin p-layer or film is formed on the p-substrate. Generally, step 130 includes mixing a binder, such as epoxy, with nanocrystalline organic semiconductors. In one embodiment, nanocrystalline OSCs are dispersed in a polymer matrix at a high concentration (such as about 60 percent by volume) with the polymer simply being used as a binder with its concentration kept to a practical minimum. Dispersion is achieved by ball milling (or some other appropriate technique for mixing the polymer matrix and OSCs) the nanocrystalline powder with a polymer and a solvent. Then, the dispersion is formed on the substrate such as with spin coating, blade coating, and the like to make a film on the substrate. To provide a built-in electric field, a charge additive is also dispersed at a much lower volume, such as less than 5 percent by volume, during the mixing or dispersing portion of step 130. The charge additive generally provides an anion to provide an uncompensated negative charge after bonding at 160 and may take many forms including glycerol-2-phosphate, glucose-6-phosphate and other anion providers.

At 140, the n-substrate or second contact is fabricated (or received as a pre-fabricated piece) in a manner similar to that described for the p-substrate or first contact at 120. At 150, a thin n-layer or film is formed on the n-substrate. As with step 130, the n-layer is formed by first dispersing, such as with ball milling or other techniques, a volume of organic (or in some cases, inorganic) nanocrystals in a polymer matrix usually in powder form. Solvent or other mixing additives are used to facilitate the mixing of these components of the n-layer. In one embodiment, the noncrystals are n-type PPyEI crystals and a cation additive is also dispersed during 150 so as to provide cations at the interface upon binding of the n-layer to the p-layer. The percent by volume of each component may vary to practice the invention with the organic semiconductor nanocrystals preferably making up the largest percentage, such as up to 60 percent, the cation additive (such as quarternized triethanolamine, and the like) being a relatively small percentage such as 1 to 5 percent, and the polymer matrix and solvent being the remaining volume of the material for the n-layer.

While numerous polymers and other materials may be used for the binder portion of the n and p layers, epoxy or epoxy cements (such as b-phase epoxy polymer) are one preferred binder material. There are several reasons for this choice: (1) epoxies wet numerous types of surfaces extremely well, which should eliminate or control adhesion problems at the interface and also minimize or control the number of pinholes in the resulting films or layers; (2) once cross-linked (i.e., cured), epoxies are rugged, flexible, and practically insoluble; (3) because of the epoxy polymer chemistry, it is easy to add extra functionalities that will be immobilized (i.e., covalently bound) during the curing process, such as the charge additives; (4) epoxies can have excellent transparencies from the near ultraviolet to approximately 2500 nm wavelengths while also having high dielectric breakdown potentials; (5) epoxies have refractive indexes nearly identical to glass, which will minimize reflective losses; (6) decades of experience have made epoxy polymers one of the engineering polymers of choice for a wide range of applications, which should result in manufacturing of solar cells based on epoxy films being simple and inexpensive. In addition to epoxy, other polymer binders may be useful such as cross-linkable polymers, e.g., polyurethanes, polyacrylates, and the like.

Referring again to FIG. 1, at 160 the p-layer and n-layer are bound together to form a bi-layer substrate (which in base form is an OPV cell according to the present invention). The bonding may be accomplished in numerous ways including roll-to-roll processing known in the field of plastics manufacturing. In some embodiments, the epoxy in the n and p layers is not allowed to cure or set up prior to step 160 to provide better adhesion between the n and p layers at step 160. For example, the epoxy in the layers may be still capable of flowing and still be sticky (e.g., requiring the concurrent manufacture of the two semiconductor layers). The two films are then pressed together using a heated roll press or other device able to apply pressure and heat during the final curing process of the epoxy. The roll press (with a quasi 2-dimensional pressure line) and the use of flexible substrates (at least in some embodiments) allow very thin films (such as about 150 nm or less in thickness) to bind intimately to each other. The pressure makes the B-phase epoxy flow and forces the incompressible OSCs to make good contact with each other and with their substrate materials or binder. Using an appropriate amount of epoxy or binder and OSCs, this exemplary process produces a PV cell with good electrical contact or crystal-to-crystal contact and seals the cell at the same time. In other examples, heat is applied to better bond the n and p layers, e.g., to anneal the two surfaces together.

In some embodiments, byproducts of the bonding process include mobile ions (such as water, HCl, precipitating ions (e.g., NaCl and other salts) and the like) produced when the cation and anion additives react to produce uncompensated positive and negative charges or charged particles in the p and n layers. Hence, at 170, the method 100 may include a step of removing these mobile counter ions such as by applying a vacuum to the interface. In other embodiments, step 170 is not performed and the counter ions are allowed to remain in the bi-layer substrate. At 180, the bi-layer substrate is further processed to form a finished product, such as by cutting the substrate to a desired shape and size and adding leads to the first and second contacts to form an OPV solar cell, using the substrate as part of a window fabrication process to produce a power window (such as by using the substrate with leads as one or more panes in a window or in addition to glass panes), and by otherwise including the bi-layer product (basic OPV cell of the invention) as part of products that utilize a component for converting light to electrical energy. As can be seen from the above discussion, the method 100 provides a low energy, low temperature, low cost manufacturing process that provides many advantages over existing inorganic PV cell manufacturing methods.

Figure 2:
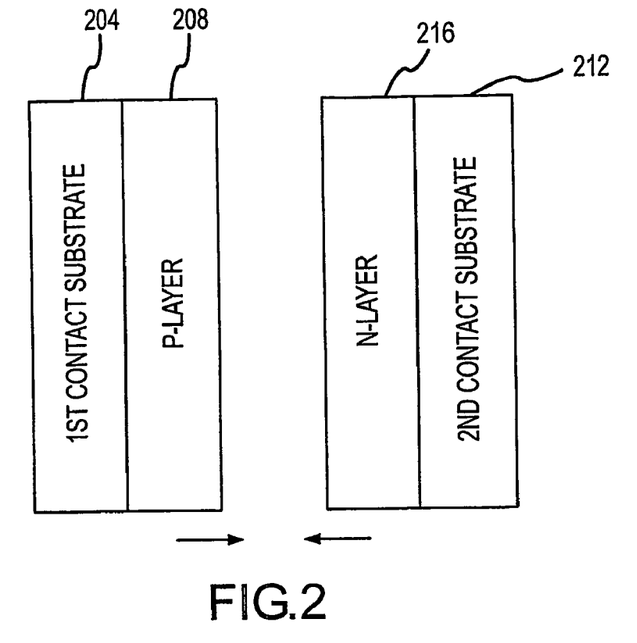
FIG. 2 is an exploded end view of an OPV cell being manufactured according to the process of FIG. 1 showing the formation of a p-type semiconductor film on a conductive substrate and an n-type semiconductor film on a separate conductive substrate.
Figure 3:
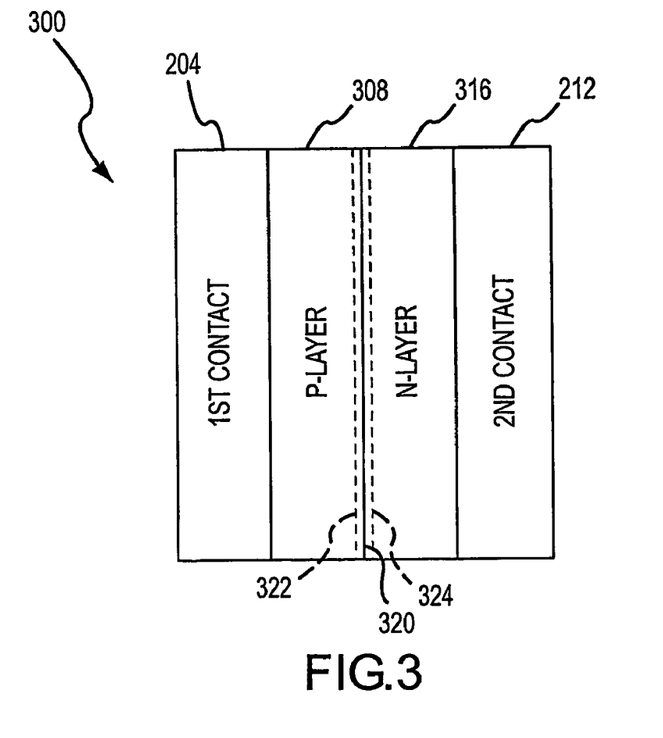
FIG. 3 is an end view of an assembled OPV cell formed by bonding the p-type film to the n-type film.

The formation of an OPV (or IPV) cell according to the method 100 can be seen in FIGS. 2 and 3. FIG. 2 illustrates the formation of a p-layer 208 on a first contact or substrate 204 and the formation of an n-layer 216 on a second substrate 212 (of course, the contacts 204, 212 may be formed after the layers 208, 216 or even after the bonding of these two layers 208, 216).

FIG. 3 illustrates a bi-layer substrate (basic OPV or IPV cell 300) that is formed by bonding the p-layer 308 and the n-layer 316. The layers 308, 316 are numbered differently in FIG. 3 than in FIG. 2 to make it clear that the binding typically changes the physical characteristics of the layers 308, 316. More particularly, the forcing of the p-layer into contact with the n-layer results in an interface or p-n heterojunction 320 being formed in the bi-layer substrate 300 and in each layer 308, 316 a very thin charged area 322, 324, respectively, is formed. In the charged areas 322, 324, cations and anions are created, with mobile counter ions being removed during the formation process (such as in step 170 of method 100) or being allowed to remain dispersed in the layers 308, 316. In this manner, an electric field is produced in the bi-layer substrate or PV cell 300 that is concentrated or dropped at the interface 320 and that acts to limit recombination in the substrate or PV cell 300.

The bi-layer substrate 300 effectively addresses problems associated with prior organic solar cells. The bi-layer substrate or PV device 300 is preferably made from ultrathin films 308, 316 (i.e., 100 nm or less, and more preferably about 50 nm or less in thickness). The exciton-dissociating interface 320 between the p side 308 and n side 316 ensures the facile generation of electrons and holes from the initially formed excitons (e.g., at first exposure to light at one of the contacts 204, 212). Such cells or devices 300 do not require illumination through a semi-transparent metal electrode, as one of the contacts 204, 212 may be transparent, such as a F—$SnO_2$ contact.

The use of ultrathin films 308, 316 minimizes or limits resistive losses with 50 nm typically being all that is needed in thickness of each film 308, 316 to absorb all or most of the received light. Even without the inclusion of charge additives in the layers 308, 316 these cells 300 are expected to have a relatively high efficiency, such as up to 5 percent or more, relative to existing OPV cells, with efficiency being limited by interfacial carrier recombination at the p-n junction 320 and to a lesser degree by the relatively slow transport from one crystal to another through the polymer binder. To further improve efficiency by 20 or more times, the charge additives are included in the layers 208, 216 such that upon bonding the layers 308, 316 include oppositely charged areas 322, 324 that create a dipole or electric field at the interface 320.

One aspect of the invention is creating OPV cells with an electric field integrally formed at the p-n junction or interface. This is an important aspect of the invention as conventional inorganic solar cells relied on doping of semiconductors precisely both in magnitude and in spatial extent, but this is very difficult if not impossible with organic semiconductors. The dropping of the built in field at the interface aspect of the invention is achieved by separating electrically inert ions in the two abutting p and n films, and this results in an effect almost identical to doping for an organic semiconductor in the electric field. The process of forming this field may include a variety of steps and processes but generally involves separating ions that are external to the semiconductor crystals, which allows any semiconductor to be used, as no chemical changes to the semiconductor are required. In other words, intrinsic semiconductors of any kind that reside in an electric field will behave as if they are doped. Specifically, if a bi-layer film (layers 308, 316 of FIG. 3) is formed with a built-in ionic electric field, the organic semiconductor crystals on the positive side will act as if they are doped n-type and the crystals on the negative side will act as if they are doped p-type.

Figure 4:
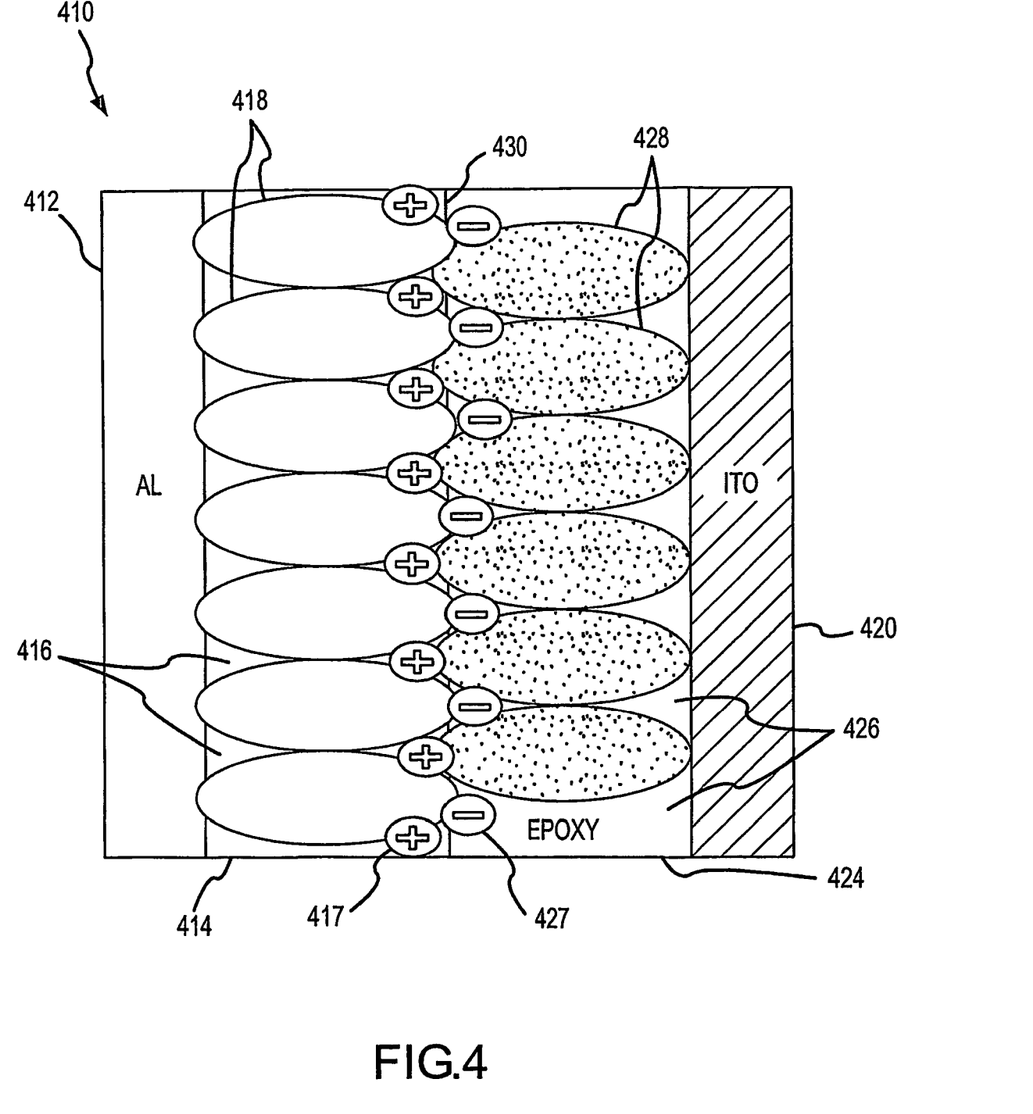
FIG. 4 is a simplified schematic of a cross section of one embodiment of an OPV cell formed according to the invention illustrating the development of an electric field at the p-n interface.
Figure 5:
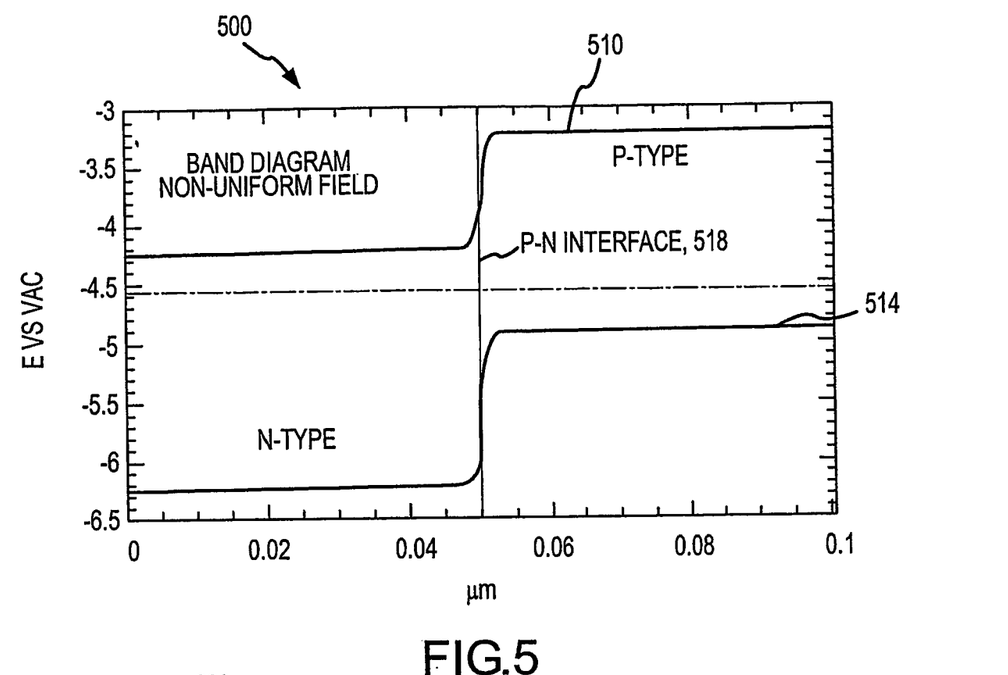
FIG. 5 is a band diagram of an OPV cell, such as the cells shown in FIGS. 3 and 4, in which an electric field is dropped at the p-n interface of the cell.

This is illustrated in simplified form in FIG. 4, which shows a PV cell 410 according to the invention. As shown, the cell 410 includes a first contact 412 formed of Al abutting an n-type layer 414 of polymer binder 416 (such as epoxy), inorganic or organic semiconductor crystals 418 (such as n-type PPyEI nanocrystals), uncompensated positively charged ions 417, and solvent or other mixing additives (not shown) as needed for forming the layer 414. The n-type layer 414 abuts at interface 430 p-type layer 424 which includes polymer binder 426 (such as epoxy), inorganic or organic semiconductor crystals 428, uncompensated negatively charged ions 427 (such as p-type TiOPc nanocrystals), and solvent or other mixing additives (not shown). The p-type layer 424 abuts second contact 420, which is shown to be formed of ITO but other materials may be used, and in a completed cell 410 leads would be provided in contact with conductive contact layers 412, 420. As shown, an electric field is created at the interface 430 by the interaction of the cations 417 and anions 427. FIG. 5 illustrates the expected band diagram 500 for the cell 410 showing the energy, for the p-type with line 510 and the n-type with line 514, relative to distance across the cell 410, and further illustrating the large offset in energy provided at the p-n interface 518 by concentrating the electric field at this location in the cell 410.

To further explain the creation of an electric field at the p-n heterojunction or semiconductor layer interface, it may be useful to provide another example of the manufacture of an OPV cell according to the invention (such as with method 100 or a method that varies in some ways from method 100). Generally, charge additives are provided in the form of salts in which the cation (for the n-type side) and the anion (for the p-type side) will react with the epoxy (or other polymer binder) as it cures and therefore, is covalently bound in place. In some embodiments, the reactive half of the salt or charge additive may contain multiple alcohol groups. Alcohols react with epoxy adhesives only under force conditions during curing (i.e., at high temperatures) and will, therefore, not cause the premature crosslinking of the polymer binder or epoxy. The counter ions produced upon binding of the semiconductor layers preferably are small and exchangeable, such as with the negative OH ion and the positive H ion. One useful pair of salts is triethanolamine quaternized with 1-bromobutane (n-type) and glycerol-2-phosphate, sodium salt (p-type).

The exemplary process includes adding glycerol-2-phosphate, sodium salt to epoxy and TiOPc (titanyl phthalocyanine) in appropriate solvent (e.g., ethyl acetate). The mixture is then ball milled or otherwise mixed until well dispersed. A thin film (such as about 50 to 250 nm or about 150 nm or less) is made on F—$SnO_2$ (note, it is preferable for this step to use a TiOPc particle size less than 50 nm to achieve the desired layer thickness). The epoxy is then cured, such as by heating at about 120° C. for about 2 hours. The substrate is soaked in dilute aqueous toluene sulfonic acid to exchange the sodium for protons without allowing anions, i.e., tosylates (excluded by size), to enter the film. The substrate is then soaked in deionized water to remove any adsorbed ions and then dried.

The process further includes adding triethanolamine quaternized with 1-bromobtane to epoxy and PPyEI (perylene-bis-2-pyridylethylimide) in appropriate solvent and ball milled until well dispersed. A thin film, such as about 150 nm thick or less, of the mixed materials is formed on top of the already deposited TiOPc film (note, it is preferable for this step to use PPyEI particles that are less than about 150 nm to achieve the desired layer thickness). The epoxy is then cured and the new multi-layer substrate is soaked in dilute aqueous TBAOH to exchange the bromide for the negative OH ions. The substrate is then soaked in deionized water to remove adsorbed ions and dried.

The bi-layer films are then dehydrated in a vacuum oven at a raised temperature, such as up to 150° C. or higher. This step is useful for removing a portion of the mobile counter ions (such as positive H ions and negative OH ions that have formed volatile water) leaving a macroscopic electric field across the p-n junction or interface between the semiconductor layers. The maximum interfacial potential difference resulting from this manufacturing approach should be about 1 V. The spatial extent of the electric field is controlled by the concentration of ions, just as the doping density controls the spatial extent of the space charge region in inorganic solar cells. Concentrating the field just over the exciton-dissociating heterojunction, rather than having it drop uniformly across the whole device, is important in achieving high efficiency in cells made according to the method. The aluminum back contact is provided, such as by evaporating, and the bi-layer OPV cell can be encapsulated with a sealant, such as silicone sealant, to avoid rehydration, which would diminish the built-in electric field.

Figure 6:
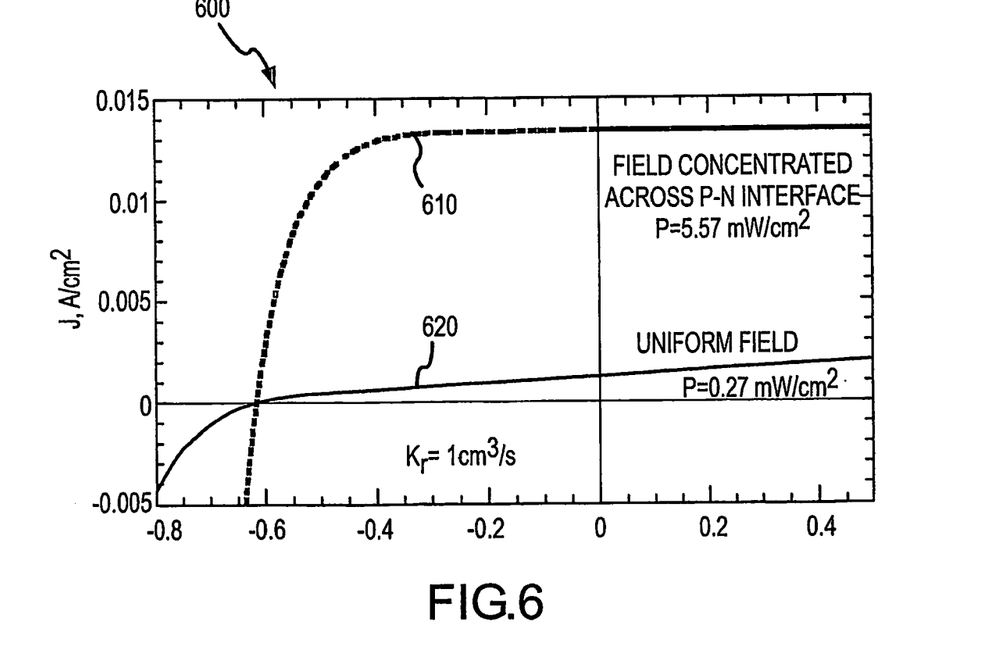
FIG. 6 is an energy graph of a simulation of an OPV cell according to the invention illustrating the large increase in efficiency produced by generating an electric field at the p-n interface rather than uniformly across the cell.

FIG. 6 illustrates a graph 600 that shows the simulated difference between an OPV cell with a uniform built-in electric field of 1 V across its thickness (such as 101 nm thickness) at line 620 and a similar cell with the same potential dropped across only the p-n heterojunction or interface (with a 2 nm tolerance) at line 610. Both OPV cells have a high recombination rate constant of 1 cm$^3$/second. Concentrating the electric field only across the p-n heterojunction results in this simulation in about a 21-fold increase in efficiency for otherwise similarly configured OPV cells. Note, prior to the present invention, application of a concentrated electric field at the interface has not been achieved with typical OPV cells applying only uniform fields from the different work functions of the contacts.

Figure 7:
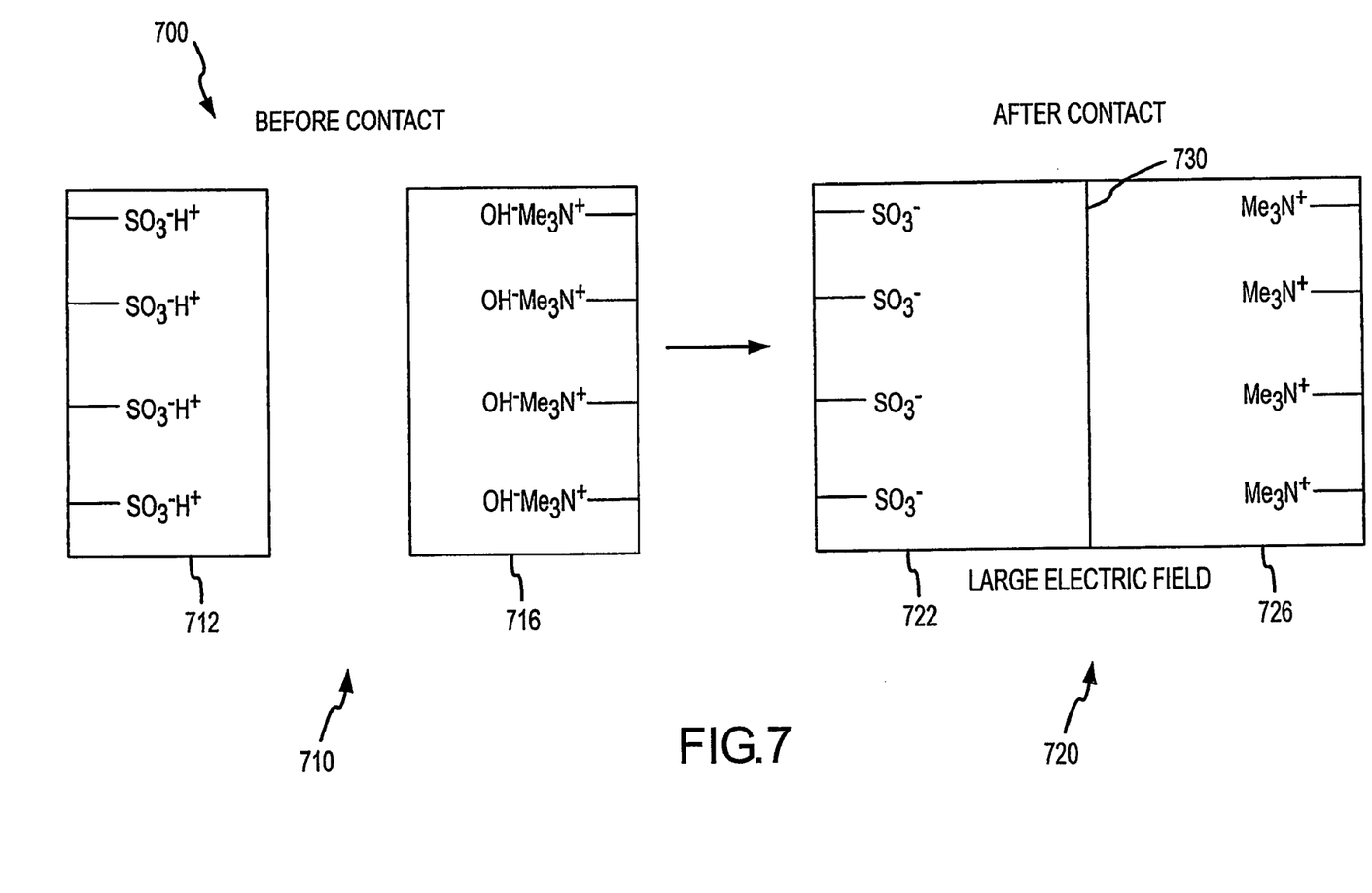
FIG. 7 is a schematic of the use of cations and anions mixed in the p-layers and n-layers of an OPV cell to produce uncompensated positive charges and uncompensated negative charges at the heterojunction interface in the OPV cell to create a desired electric field localized at the interface.

FIG. 7 shows in yet another way the concept of generating during manufacture 700 an electric field at a p-n heterojunction in a PV cell. In the "before contact" arrangement 710, the p-type layer 712 is shown to include a charge additive (i.e., $HSO_3$) that acts as an anion donor and the n-type layer 716 is shown to include a differing charge additive (i.e., $Me_3NOH$) that acts as a cation donor. This is seen in the bound cell 720 after contact is made between the p-type layer 722 and the n-type layer 726 to form a p-n heterojunction interface 730. The volatile water formed by the mobile counterions is not shown as it would typically be removed by placing the cell 720 under heat and vacuum (or by other means or, in some cases, is allowed to remain in the cell 720). The remaining uncompensated positively charged and negatively charged particles act as a dipole to create an electric field at the interface 730 that acts to control or reduce significantly recombination.

Because the method of manufacturing improved solar cells, such as OPV cells with an electric field concentrated at the p-n heterojunction, is versatile, it is easy to envision numerous products that can be made with such solar cells and extensions of the invention to new applications. One implementation (in addition to standard uses of and products that include PV cells which are within the breadth of the description) that could readily utilize PV cells manufactured by the methods of the invention is power windows. Generally, power windows are solar cells that are transparent in the visible region and, thus, can serve as optical windows while simultaneously generating power from the non-visible light that the solar cell absorbs. Most inorganic semiconductors are not amenable to power window applications because they have wide conduction bands and, thus, absorb light for 2 to 3 eV beyond their absorption threshold. To be transparent, most inorganic semiconductors must therefore have bandgaps greater than about 3 eV and can correspondingly absorb only a tiny fraction of the incident solar flux. Organic semiconductors, on the other hand, have narrow bandwidths and absorb light only over a specific range of energy.

With this in mind, one embodiment of the invention involves producing a solar cell manufactured according to method 100 of FIG. 1 or the specific example provided above except that a transparent OSC (e.g., naphthalene diimide, pyromellitic diimide, or the like) is utilized rather than less transparent OSCs (such as the perylene diimide). The solar cell would be mostly transparent with a bluish tinge from the TiOPc absorption that may be used in some cases for one of the semiconductor layers of the solar cell. The major absorption peak of TiOPc is 850 nm, is well below the visible spectrum. The solar cell is then formed as one or more of the panes of the window (or as the window in applications such as automobile windows). If a blue window is not desirable, the TiOPc can be replaced, too, with a more transparent OSC such as naphthalocyanine that absorbs light entirely in the infrared region. Leads would be provided from the contact layers of the cell to allow generated electricity to be collected and utilized in devices connected to the power windows containing the PV cells of the present invention.

The above disclosure sets forth a number of embodiments of the present invention. Other arrangements or embodiments, not precisely set forth, could be practiced under the teachings of the present invention and as set forth in the following claims. Again, it should be understood that the methods of fabricating a PV cell with a built-in electric field at the p-n heterojunction are very general in application. For example, these techniques can be used with almost any nanocrystalline semiconductor, organic or inorganic, with a large number of polymer binders, and a large number of charge additives (e.g., large number of salts). The PV cells that can implement the ideas of the invention may include multiple variations while still being understood and covered by the general ideas described above and claimed below.

Another preferred embodiment of the invention is to form PV cells with one or both of the binder layers made from polymers that already contain ionic groups. Therefore, they do not require added cation or anion additives. For example: poly(vinylpyridine) can be quaternized with, for example methyl iodide, to produce a polymer with bound cationic groups. Such a polymer can be used as the binder layer for the n-type side without any additional ionic additives. Likewise, commercially available poly(styrene) terminated with sodium carboxylate groups can be used for the binder layer for the p-type side without any additional ionic additives. As will be appreciated by those skilled in the art, the methods and cells in this description are substantially broader than simply cells that use epoxies or other polymers with added ionic groups. Instead, once the concept of applying or dropping an electric field at the p-n heterojunction is understood extensions of the inventive method and resulting PV cells will be apparent to many in the field of solar cells.

In yet another embodiment, the bound ions are incorporated into the OSCs themselves, rather than into the binders. For example: (1) PPyEI can be partially quaternized to create bound positive charges; and (2) TiOPc can be partially sulfonated to create bound negative charges. These OSCs with bound ions can then be dispersed in electrically neutral polymer binders to provide the same overall effect of applying an electric field at the interface between the two semiconductor layers and of controlling recombination in the cell.

As can be seen from the foregoing discussion with reference to FIGS. 1–7, there are several possible methods that can be used to practice the invention so as to obtain a desirable high electric field at the interface between the two field-effect doped OSCs. Preferably, the dopants (i.e., charge additives) are relatively uniformly dispersed and immobilized in their respective layers. When the p-type and n-type layers are brought into contact, entropy tends to spatially randomize the mobile small counter ions (e.g., Na+ and Cl– or H+ and OH– or the like) associated with the covalently bound dopant ions. This generates an electric field across the heterojunction of the formed cell until the decrease in enthalpy, $\Delta H$, caused by the generation of the electric field is equal and opposite to the increase in entropy, $T\Delta S$, caused by randomizing the mobile ions.

By itself, the use of charge additives is useful for generating a substantial electric field. Further, the magnitude of this equilibrium field can be enhanced in several ways. If volatile, the mobile ion pairs (such as $H_2O$ or HCL) can be removed by heat and vacuum applied during the annealing process, thereby shifting the equilibrium toward a higher field. If performed under reverse electrical bias, the shift is even greater. If the solubility product of the mobile ion pairs is low in the polymeric binder, ionic species (such as NaCl) precipitate, again shifting the equilibrium. Additionally, the mobile ions from each film can be expelled (for example, electrochemically) before the films are brought into contact. This allows, in principle, the setting of any desired interfacial potential that is less than the heterojunction bandgap (1.4 eV in some of the above-described examples). Of course, there are numerous other possible methods for enhancing the electric field obtained according to the invention.

The end result of any of these procedures is the creation of a large electrical field dropping across the junction between the n-type and p-type sides, rather than across the bulk of the device as in other OPV cells. The width of this space charge region is inversely proportional to the total concentration of dopants (not the ionized concentration). Therefore, it can be adjusted at will and made to extend more over one side (e.g., the p-type side) than the other if this is desirable. As discussed above, the films may be formed separately on their individual substrates and subsequently laminated together or they may be coated one on top of the other, with the top electrical contact added subsequently. Typically, the manufacturing technique(s) that is more optimal for both efficiency and manufacturability will be implemented to create the bi-layer cells of the present invention.

The invention claimed is:

1. A method for fabricating a bi-layer photovoltaic cell, comprising:
    mixing a plurality of p-type nanocrystalline semiconductors in a first binder matrix;
    forming a thin p-layer comprising the mixed p-type nanocrystalline semiconductors and the first binder matrix;
    mixing a plurality of n-type nanocrystalline semiconductors in a second binder matrix;
    forming a thin n-layer comprising the mixed n-type nanocrystalline semiconductors and the second binder matrix; and
    binding the p-layer and the n-layer to establish contact between at least a portion of the n-type nanocrystalline semiconductors and the p-type nanocrystalline semiconductors at a p-n heterojunction interface,
    wherein the p-type mixing further comprises mixing in a plurality of anion additives and wherein the n-type mixing further comprises mixing in a plurality of cation additives, whereby during the binding uncompensated anions are produced proximal to the interface in the p-layer and uncompensated cations are produced proximal to the interface in the n-layer, and wherein an electric field is formed integrally at the interface rather than uniformly across the cell.

2. The method of claim 1, further including processing the bound p-layer and n-layer to remove mobile counter ions at the p-n heterojunction interface.

3. The method of claim 1, wherein the binder matrices comprise an epoxy and binding is performed prior to final stages of curing the epoxy.

4. The method of claim 3, wherein the binding includes applying heat and pressure to the contacting p-layer and n-layer.

5. The method of claim 1, wherein the forming of the p-layer further comprises applying the thin p-layer to a flexible electrically conductive substrate and the forming of the n-layer further comprises applying the thin n-layer to a flexible electrically conductive substrate.

6. The method of claim 1, wherein the p-layer and the n-layer have thicknesses less than about 250 nanometers.

7. The method of claim 6, wherein the p-type nanocrystalline semiconductors and the n-type nanocrystalline semiconductors comprise single organic crystals less than about 150 nanometers in size.

8. The method of claim 7, wherein the p-type nanocrystalline semiconductors comprise p-type titanyl phthalocyanine (TiOPc) crystals and the n-type nanocrystalline semiconductors comprise n-type perylene-bis-2-pyridylethylimide (PPyEI) crystals.

9. A product comprising at least one bi-layer photovoltaic cell formed according to the method of claim 1.

10. A bi-layer photovoltaic cell, comprising:
    a first semiconductor layer comprising a binder, nanocrystals of an n-type semiconductor, and a plurality of spatially bound cations;
    a second semiconductor layer contacting the first semiconductor layer comprising a binder, nanocrystal of a p-type semiconductor, and a plurality of spatially bound anions; and
    a p-n heterojunction at the contacting interface between the first and second semiconductor layers, wherein the spatially bound cations and anions are proximal to the p-n heterojunction, wherein an electric field is integrally with the bi-layer photovoltaic cell at the p-n heterojunction.

11. The cell of claim 10, further including a first electric contact attached to the first semiconductor layer distal to the p-n heterojunction and a second electric contact abutting the second semiconductor layer distal to the p-n heterojunction.

12. The cell of claim 10, wherein the n-type and the p-type nanocrystals are smaller than about 150 nanometers and comprise organic crystals.

13. The cell of claim 10, wherein the binders comprise a polymer matrix.

14. The cell of claim 13, wherein the polymer matrix comprises an epoxy.

15. The cell of claim 10, wherein the nanocrystals of the n-type semiconductor comprise a portion of the volume of the first semiconductor layer larger than a portion of the volume of the first semiconductor layer comprising the binder and wherein the nanocrystals of the p-type semiconductor comprise a portion of the volume of the second semiconductor layer larger than a portion of the volume of the second semiconductor layer comprising the binder.

16. A method of producing a bi-layer organic photovoltaic cell, comprising:
  forming a p-layer comprising organic nanocrystals of a p-type semiconductor, a binding matrix, and an anion additive;
  forming an n-layer comprising organic nanocrystals of an n-type semiconductor, a binding matrix, and a cation additive;
  binding the p-layer and the n-layer to create a p-n heterojunction interface between abutting portions of the p-type semiconductor organic nanocrystals and the n-type semiconductor organic nanocrystals, wherein the anion and cation additives interact to create a dipole or electric field at the p-n heterojunction interface, whereby the dipole or electric field is concentrated at the p-n heterojunction interface rather than dropping uniformly across the bi-layer organic photovoltaic cell.

17. The method of claim 16, wherein the p-type semiconductor organic nanocrystals comprise greater than about 60 percent of the volume of the p-layer and the n-type semiconductor organic nanocrystals comprise greater than about 60 percent of the volume of the n-layer.

18. The method of claim 16, wherein the anion additive is substantially uniformly dispersed in the p-layer and comprises a first salt and wherein the cation additive is substantially dispersed in the n-layer and comprises a second salt.

19. The method of claim 18, wherein the first salt comprises glycerol-2-phosphate, sodium salt and the second salt comprises triethanoloamine quaternized with 1-bromobutane.

20. The method of claim 16, further comprising prior to the binding of the p-layer end the n-layer, expelling a plurality of a first mobile ion produced during the p-layer forming from the p-layer and a plurality of a second mobile ion produced during the n-layer forming from the n-layer to set an interfacial potential of the p-n heterojunction interface.

21. The method of claim 16, further comprising during the binding of the p-layer and the n-layer, removing at least a portion of volatile mobile ions generated in the n-layer or the p-layer.

22. The method of claim 21, wherein the removing of the volatile mobile ions is performed under reverse electrical bias.

23. The method of claim 16, wherein the p-layer has a thickness of less than about 250 nm and the n-layer has a thickness of less than about 250 nm.

24. The method of claim 23, wherein the p-type semiconductor organic nanocrystals comprise titanyl phthalocyanine (TiOPc) and the n-type semiconductor organic nanocrystals comprise perylene-bis-2-pyridylethylimide (PPyEI) each having a size less than about 150 nm.

25. The method of claim 16, wherein the binding matrices comprise epoxy and the binding of the p-layer and the n-layer is performed prior to curing of the epoxy.

26. The method of claim 16, further comprising providing a first electrically conductive substrate abutting the p-layer on a side opposite the p-n heterojunction and providing a second electrically conductive substrate abutting the n-layer on a side opposite the p-n heterojunction.

27. The method of claim 16, wherein the p-layer further comprises inorganic nanocrystals of a p-type semiconductor.

28. The method of claim 16, wherein the n-layer further comprises inorganic nanocrystals of an n-type semiconductor.

29. The method of claim 16, further comprising after the binding, dehydrating the bound p-layer and n-layer in a vacuum oven at a raised temperature.

30. The method of claim 16, wherein the binding matrix of the p-layer comprises the anion additive or the binding matrix of the n-layer comprises the cation additive.

31. The method of claim 16, wherein the anion additive is incorporated into the p-type semiconductor organic nanocrystals or the cation additive is incorporated into the n-type semiconductor organic nanocrystals.

32. A power window comprising a cell formed by the method of claim 16, wherein the p-type semiconductor organic nanocrystals, the n-type semiconductor organic nanocrystals, the binding matrices, the anion additive, and the cation additive are substantially transparent.

* * * * *